(12) United States Patent
Ro et al.

(10) Patent No.: US 12,099,839 B2
(45) Date of Patent: Sep. 24, 2024

(54) MEMORY DEVICE FOR PERFORMING IN-MEMORY PROCESSING

(71) Applicant: Samsung Electronics Co., Ltd., Suwon-si (KR)

(72) Inventors: Yuhwan Ro, Seongnam-si (KR);
Shinhaeng Kang, Hwaseong-si (KR);
Seongil O, Hwaseong-si (KR);
Seungwoo Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 17/314,476

(22) Filed: May 7, 2021

(65) Prior Publication Data
US 2022/0107803 A1    Apr. 7, 2022

(30) Foreign Application Priority Data

Oct. 5, 2020    (KR) .................. 10-2020-0128274

(51) Int. Cl.
*G06F 9/30*    (2018.01)
*G06F 9/50*    (2006.01)
(Continued)

(52) U.S. Cl.
CPC ........ *G06F 9/3001* (2013.01); *G06F 9/30079* (2013.01); *G06F 9/30101* (2013.01);
(Continued)

(58) Field of Classification Search
CPC ............. G06F 13/1621; G06F 15/7821; G06F 9/3001; G06F 9/30076; G06F 9/301; G06F 9/5016; G06F 12/06; H03K 19/1737
(Continued)

(56) References Cited

U.S. PATENT DOCUMENTS 5,270,832 A * 12/1993 Balkanski .............. H04N 19/42
382/250
5,459,846 A    10/1995 Hyatt
(Continued)

FOREIGN PATENT DOCUMENTS

JP           5-265853 A      10/1993
KR    10-0285136 B1       3/2001
(Continued)

OTHER PUBLICATIONS

Vinçon, Tobias, et al., "Moving Processing to Data: On the Influence of Processing in Memory on Data Management", arXiv preprint arXiv:1905.04767, May 12, 2019 (21 pages in English).
(Continued)

*Primary Examiner* — Reginald G Bragdon
*Assistant Examiner* — Aaron D Ho
(74) *Attorney, Agent, or Firm* — NSIP Law

(57) ABSTRACT

A memory device configured to perform in-memory processing includes a plurality of in-memory arithmetic units each configured to perform in-memory processing of a pipelined arithmetic operation, and a plurality of memory banks allocated to the in-memory arithmetic units such that a set of n memory banks is allocated to each of the in-memory operation units, each memory bank configured to perform an access operation of data requested from the in-memory arithmetic units while the pipelined arithmetic operation is performed. Each of the in-memory arithmetic units is configured to operate at a first operating frequency that is less than or equal to a product of n and a second operating frequency of each of the memory banks.

18 Claims, 17 Drawing Sheets

(51) Int. Cl.
*G06F 12/06* (2006.01)
*G06F 13/16* (2006.01)
*G06F 15/78* (2006.01)
*H03K 19/173* (2006.01)

(52) U.S. Cl.
CPC ............ *G06F 9/5016* (2013.01); *G06F 12/06* (2013.01); *G06F 13/1621* (2013.01); *G06F 15/7821* (2013.01); *H03K 19/1737* (2013.01)

(58) Field of Classification Search
USPC .......................................................... 711/100
See application file for complete search history.

(56) References Cited

U.S. PATENT DOCUMENTS

| | | | | |
|---|---|---|---|---|
| 5,559,986 | A * | 9/1996 | Alpert | G06F 12/0851 |
| | | | | 711/E12.047 |
| 6,993,637 | B1 * | 1/2006 | Kwong | G06F 13/1663 |
| | | | | 711/167 |
| 8,234,441 | B2 | 7/2012 | Uchiyama et al. | |
| 8,874,837 | B2 | 10/2014 | Neely et al. | |
| 2002/0001894 | A1 * | 1/2002 | Lee | G11C 11/40611 |
| | | | | 438/200 |
| 2003/0145162 | A1 * | 7/2003 | Casper | G06F 12/06 |
| | | | | 711/167 |
| 2005/0166021 | A1 * | 7/2005 | Leijten | G11C 7/1075 |
| | | | | 711/149 |
| 2011/0191564 | A1 * | 8/2011 | Roy | G11C 7/1069 |
| | | | | 711/E12.001 |
| 2013/0036288 | A1 * | 2/2013 | Ansari | H04L 69/02 |
| | | | | 711/170 |
| 2016/0188499 | A1 * | 6/2016 | Nagarajan | G06F 13/1663 |
| | | | | 711/150 |
| 2018/0217929 | A1 * | 8/2018 | Lillibridge | G06F 3/0644 |
| 2018/0322382 | A1 | 11/2018 | Mellempudi et al. | |
| 2020/0243154 | A1 * | 7/2020 | Sity | G11C 29/38 |
| 2021/0208811 | A1 * | 7/2021 | Kim | G06F 3/0673 |
| 2021/0208814 | A1 * | 7/2021 | Song | G06F 7/5443 |
| 2021/0216243 | A1 * | 7/2021 | Shin | G06F 3/0659 |
| 2021/0373805 | A1 * | 12/2021 | Alsop | G06F 3/0629 |
| 2021/0389907 | A1 * | 12/2021 | Alsop | G06F 3/0604 |
| 2021/0397376 | A1 | 12/2021 | Ro et al. | |
| 2022/0068366 | A1 * | 3/2022 | Kwon | G11C 11/4076 |
| 2022/0164297 | A1 * | 5/2022 | Sity | G06F 12/0802 |
| 2022/0206869 | A1 * | 6/2022 | Ramachandran | G06F 3/0673 |

FOREIGN PATENT DOCUMENTS

| | | |
|---|---|---|
| KR | 10-1798279 B1 | 11/2017 |
| KR | 10-2021-0156058 A | 12/2021 |

OTHER PUBLICATIONS

"UPMEM Announces the First Processing In-Memory Chip Accelerating Big Data Applications" PRN Newswire, Sep. 7, 2017 (5 pages in English).

* cited by examiner

MEMORY DEVICE FOR PERFORMING IN-MEMORY PROCESSING

CROSS-REFERENCE TO RELATED APPLICATION

This application is based on and claims priority under 35 U.S.C. § 119 to Korean Patent Application No. 10-2020-0128274, filed on Oct. 5, 2020, in the Korean Intellectual Property Office, the entire disclosure of which is incorporated by reference herein for all purposes.

BACKGROUND

1. Field

The following description relates to a memory device that performs in-memory processing by using an in-memory arithmetic unit.

2. Description of Related Art

Applications such as processing of graphics algorithms, processing of neural networks, and so on, are compute-intensive arithmetic operations and require a computing system with large-capacity arithmetic operation and memory capabilities. Memory devices have been developed which are capable of performing some arithmetic operations (computation operations) of a computing system as internal processing (or in-memory processing) of memory devices. As such, the burden of arithmetic operations of a computing system may be reduced by internal processing of a memory device. However, when separate processing hardware for internal processing is added to a memory device, methods of efficiently performing arithmetic operation processing thereof may be required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A memory device that performs in-memory processing.

In one general aspect, a memory device configured to perform in-memory processing includes a plurality of in-memory arithmetic units each configured to perform in-memory processing of a pipelined arithmetic operation, and a plurality of memory banks allocated to the in-memory arithmetic units such that a set of n memory banks is allocated to each of the in-memory operation units, each memory bank configured to perform an access operation of data requested from the in-memory arithmetic units while the pipelined arithmetic operation is performed. Each of the in-memory arithmetic units is configured to operate at a first operating frequency that is less than or equal to a product of n and a second operating frequency of each of the memory banks.

The arithmetic operation may be pipelined into multi-pipeline stages of sub-arithmetic units capable of being processed within a first operation cycle corresponding to the first operating frequency.

Each of the in-memory arithmetic units may be configured to access any number of the allocated n memory banks within a second operation cycle corresponding to the second operating frequency of each of the memory banks.

The memory device may include a pipeline register configured to buffer sub-arithmetic operation results of pipeline stages of the pipelined arithmetic operation.

The memory device may include a clock divider configured to generate, based on an externally provided clock signal, a first clock signal for the in-memory arithmetic units to operate at the first operating frequency and to distribute the first clock signal to the in-memory arithmetic units.

The memory device may include a bank selector configured to sequentially enable one or more of the n memory banks allocated to a first in-memory arithmetic unit, which is included in the plurality of in-memory arithmetic units; a multiplexer configured to provide the first in-memory arithmetic unit with data accessed from the one or more memory banks enabled by the bank selector; and a bank arbiter configured to control data to be output from the multiplexer.

The bank selector may be configured to operate based on the second operating frequency, and the bank arbiter is configured to operate based on the first operating frequency.

The n memory banks allocated to a first in-memory arithmetic unit, which is included in the plurality of in-memory arithmetic units, may include a first memory bank in which a first operand is stored and a second memory bank in which a second operand is stored, the memory device may include a first multiplexer for multiplexing the first operand and a second multiplexer for multiplexing the second operand, and, the first multiplexer and the second multiplexer may be provided between the n memory banks allocated to a first in-memory arithmetic unit and the first in-memory arithmetic unit.

The first multiplexer and the second multiplexer may be configured to provide the first in-memory arithmetic unit with the first operand and the second operand within a first operation cycle corresponding to the first operating frequency.

In another general aspect, a memory device configured to perform in-memory processing includes a plurality of in-memory arithmetic units configured to perform in-memory processing of a pipelined arithmetic operation; a plurality of memory banks allocated to each of the in-memory arithmetic units such that a set of n memory banks is allocated to each of the in-memory operation units, each memory bank configured to perform an access operation of data requested from the in-memory arithmetic units while the pipelined arithmetic operation is performed; and at least one multiplexer configured to provide each of the in-memory arithmetic units with data accessed from at least one memory bank that is enabled among the n memory banks allocated to each of the in-memory arithmetic units, wherein each of the in-memory arithmetic units is configured to operate at a first operating frequency that is less than or equal to a product of n and a second operating frequency of each of the memory banks.

Other features and aspects will be apparent from the following detailed description, the drawings, and the claims.

Figure 1:
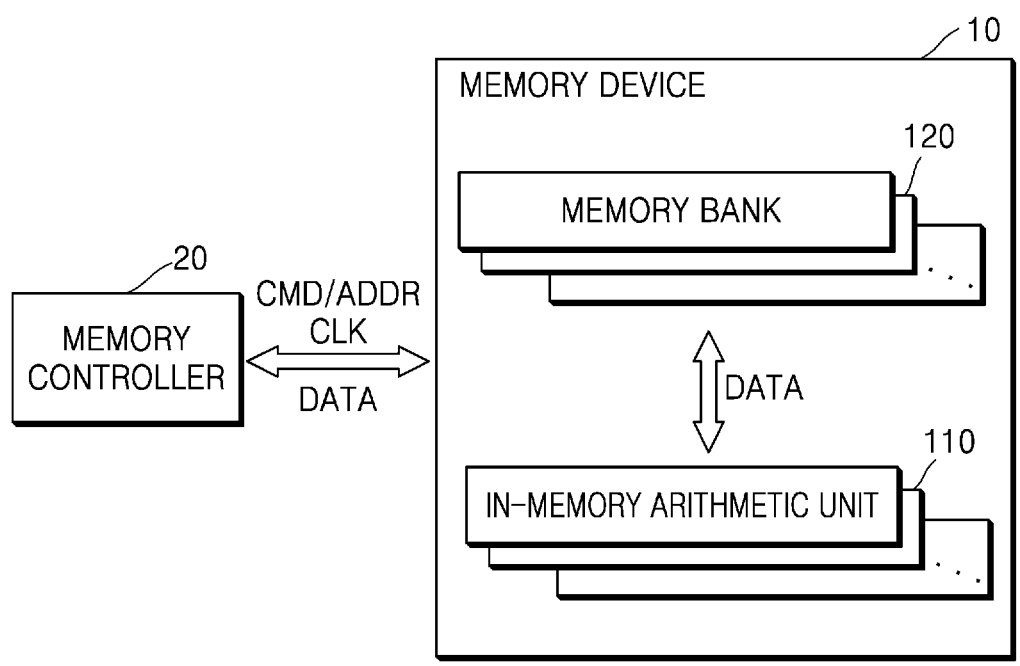
FIG. 1 is a block diagram illustrating a memory system according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

FIG. 1 is a block diagram illustrating a memory system according to an example.

Referring to FIG. 1, a memory system 1 may include a memory device 10 and a memory controller 20. The memory device 10 may include a plurality of in-memory arithmetic units 110 that perform in-memory processing and a plurality of memory banks 120 including a plurality of memory cells.

The memory device 10 may be implemented as a memory chip or a memory module. The memory controller 20 may be implemented as part of a host, or the memory device 10 and the memory controller 20 may also be arranged in one memory module. That is, an implementation form may be various and is not limited to one configuration. Meanwhile, although not illustrated in FIG. 1, a host may be a functional block that controls the memory system 1 to perform a computing operation and may serve as a central processing unit (CPU), a digital signal processor (DSP), a graphics processing unit (GPU), or an application processor (AP).

The memory controller 20 may control an overall operation of the memory device 10 by providing various signals to the memory device 10. For example, the memory controller 20 may control a memory access operation of the memory device 10, such as read or write. Specifically, the memory controller 20 may provide a command CMD and an address ADDR to the memory device 10 to write data DATA to the memory device 10 or read data DATA from the memory device 10. In addition, the memory controller 20 may further provide a clock signal CLK to the memory device 10.

The command CMD may include an active command for setting the memory banks 120 to an active state to read data or write data. The memory device 10 may activate rows, that is, word lines included in the memory banks 120 in response to an active command. In addition, the command CMD may include a precharge command for switching the memory banks 120 from an active state to a standby state after data read or data write is completed. In addition, the command CMD may include a refresh command for controlling refresh operations of the memory banks 120. However, the type of the command CMD described herein is only exemplary, and there are different types of the command CMD.

In addition, the memory controller 20 may control in-memory processing operations of the in-memory arithmetic units 110 by providing various signals to the memory device 10. For example, the memory controller 20 may provide the memory device 10 with a signal generated by combining the command CMD, the address ADDR, and/or the clock signal CLK to indicate in-memory processing operations of the in-memory arithmetic units 110.

The in-memory arithmetic units 110 may be implemented as processing elements (PEs) for performing arithmetic processing in the memory device 10. That is, the in-memory arithmetic units 110 may perform in-memory processing (or internal processing) in the memory device 10.

Specifically, the in-memory arithmetic units 110 may perform data operations on the data DATA stored in the memory banks 120 and/or the data DATA received from the memory controller 20, and may store data DATA of the arithmetic operation result in the memory banks 120 or provide the data to the memory controller 20. Accordingly, the in-memory arithmetic units 110 may also be referred to as a function-in-memory (FIM) or a processor in memory (PIM).

The in-memory arithmetic units 110 may be an arithmetic logic unit (ALU) or a multiply-accumulate (MAC). For example, the in-memory arithmetic units 110 may perform data inversion, data shift, data swap, data comparison, logical operations such as AND and exclusive OR (XOR), mathematical operations such as addition and subtraction, and data operations.

The number of in-memory arithmetic units 110 included in the memory device 10 and the number of memory banks 120 included in the memory device 10 may be changed. In addition, n (where n is a natural number) memory banks may be allocated to one in-memory arithmetic unit.

For example, when the memory device 10 is a double data rate 4 dynamic random access memory (DDR4 DRAM) module, the number of memory banks 120 is 16, and the number of in-memory arithmetic units 110 is 8. In this case, the in-memory arithmetic units 110 and the memory banks 120 may be mapped at a ratio of 1:2 (n=2 and n is a natural number). Alternatively, the number of memory banks 120 may be 16, and the number of in-memory arithmetic units 110 may be 4, and in this case, the in-memory arithmetic units 110 and the memory banks 120 may be mapped at a ratio of 1:4 (n=4). That is, according to the various examples, a mapping ratio between the in-memory arithmetic units 110 and the memory banks 120 may be varied.

Each of the memory banks 120 may include a plurality of memory cells. Specifically, the memory cells of the memory banks 120 may be located at points where a plurality of word lines and a plurality of bit lines cross each other. The memory banks 120 may store in-memory processing data. Here, the in-memory processing data may include data on which arithmetic operations will be performed by the in-memory arithmetic units 110 and/or data generated as a result of the arithmetic operations of the in-memory arithmetic units 110.

The memory device 10 may include various types of memory, for example, a dynamic random access memory (DRAM) such as a double data rate synchronous dynamic random access memory (DDR SDRAM), a low power double data rate (LPDDR) SDRAM, a graphics double data rate (GDDR) SDRAM, or a Rambus dynamic random access memory (RDRAM). However, the various examples herein are not limited thereto, and the memory device 10 may include a nonvolatile memory such as a flash memory, a magnetic random access memory (MRAM), a ferroelectric RAM (FeRAM), a phase change RAM (PRAM), or a resistive RAM (ReRAM).

Figure 2A:
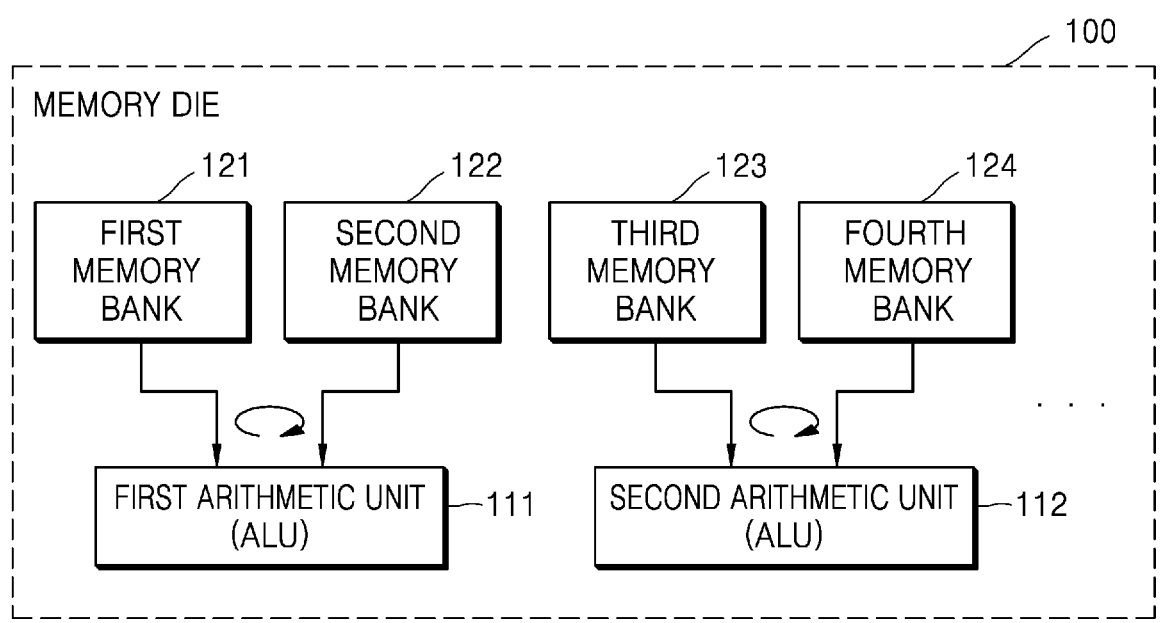
FIGS. 2A and 2B are diagrams illustrating allocation ratios between memory banks and an in-memory arithmetic unit according to an example.
Figure 2B:
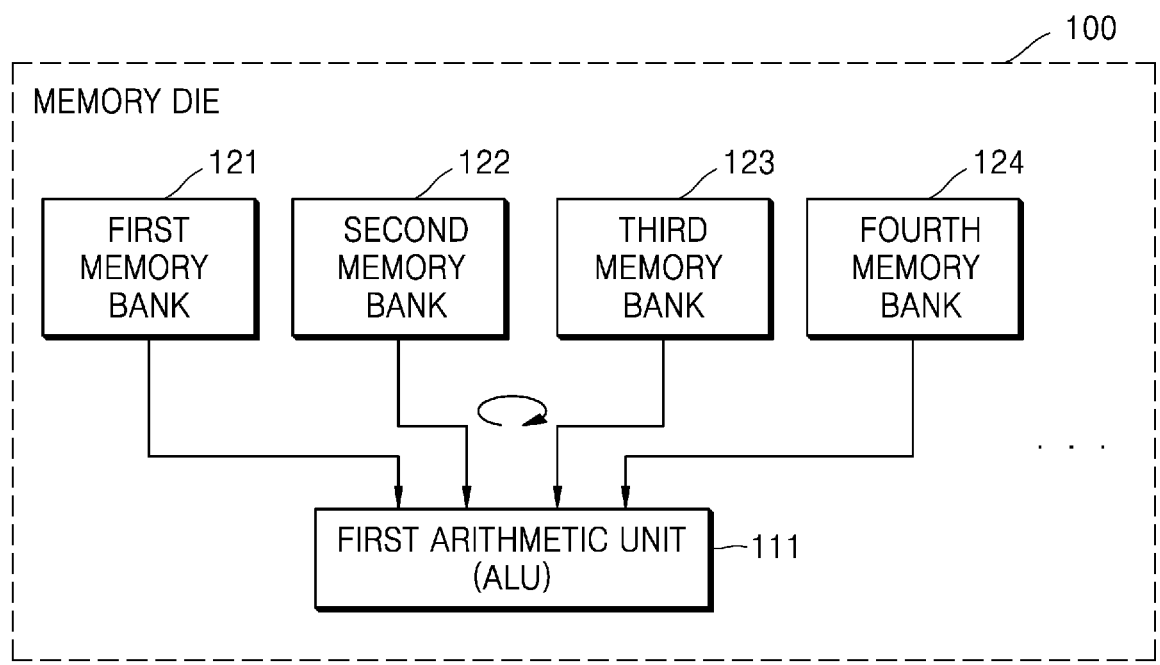

FIGS. 2A and 2B are diagrams illustrating allocation ratios between memory banks and in-memory arithmetic units according to an example.

The memory device 10 illustrated in FIG. 1 may include a memory die 100 in which the in-memory arithmetic units 110 illustrated in FIG. 1 and the memory banks 120 illustrated in FIG. 1 are arranged, and FIGS. 2A and 2B illustrate some of the in-memory arithmetic units 110 included in the memory die 100 and some of the memory banks 120 included therein.

As illustrated in FIG. 2A, two memory banks (a first memory bank 121 and a second memory bank 122) may be allocated to one in-memory arithmetic unit (a first arithmetic unit 111), and two memory banks (a third memory bank 123 and a fourth memory bank 124) may be allocated to one in-memory arithmetic unit (a second arithmetic unit 112).

Alternatively, as illustrated in FIG. 2B, four memory banks (the first memory bank 121, the second memory bank 122, the third memory bank 123, and the fourth memory bank 124) may be allocated to one in-memory arithmetic unit (the first arithmetic unit 111).

That is, memory banks 120 included in the memory device 10 may share one in-memory arithmetic unit in units of n memory banks, and each of the in-memory arithmetic units may access n memory banks corresponding thereto to perform data operations. Here, when the memory device 10 corresponds to a DDR4 DRAM module, n may be any one of 2, 4, and 8 but is not limited thereto.

Figure 3:
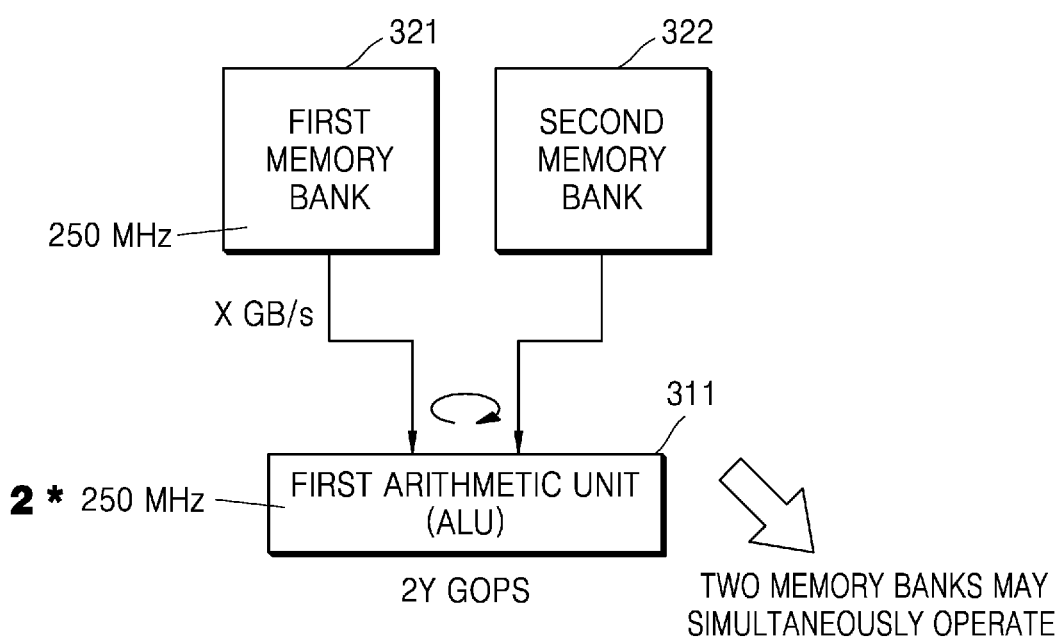
FIGS. 3 and 4 are diagrams for comparing and explaining a difference between operations of memory banks due to a difference in operating frequency of an in-memory arithmetic unit, according to an example.
Figure 4:
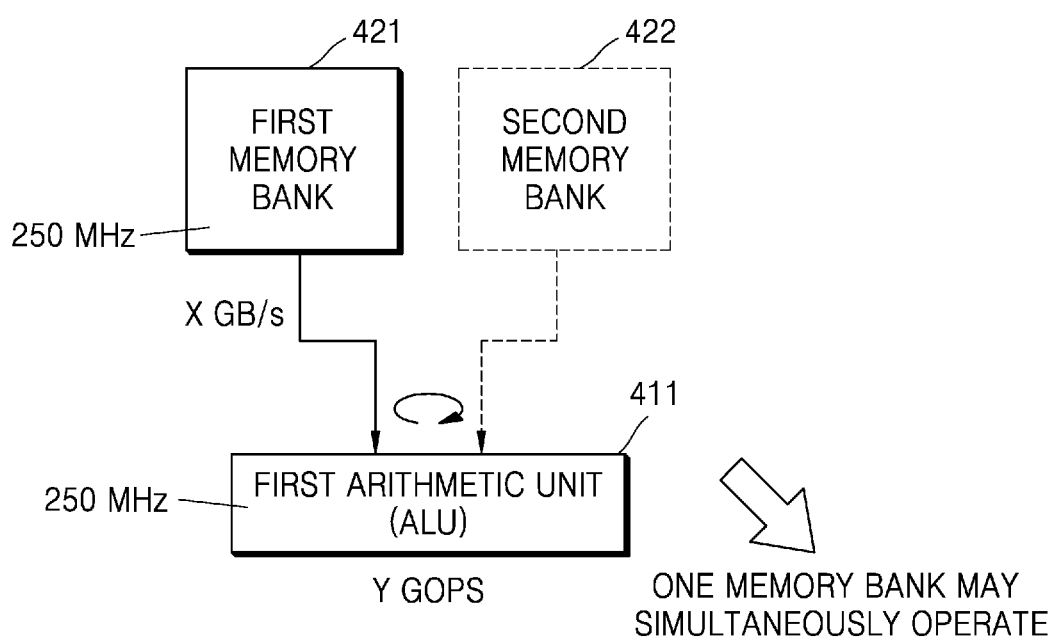

FIGS. 3 and 4 are diagrams for comparing and explaining a difference between operations of memory banks due to a difference in operating frequency of an in-memory arithmetic unit, according to an example.

Referring to FIGS. 3 and 4, two memory banks (first memory bank 321 or 421 and second memory bank 322 or 422) share one in-memory arithmetic unit (first arithmetic unit 311 or 411). It is assumed that data transmission and data reception are performed at a speed of X GB/s between the first memory banks 321 and 421, the second memory banks 322 and 422, and the first arithmetic units 311 and 411, and it is assumed that the memory banks 321 and 421 and the second memory banks 322 and 422 operate at an operating frequency (second operating frequency) of 250 MHz. Here, the operating frequency of 250 MHz is a random value exemplified for the sake of convenient description.

According to FIG. 3, when the operating frequency (first operating frequency) of the first arithmetic unit 311 is 500 MHz (2×250 MHz) corresponding to twice the operating frequency (n=2) of each of the memory banks 321 and 322, the first arithmetic unit 311 may substantially simultaneously access the first memory bank 321 and the second memory bank 322 within an operation cycle ($1/(250\times10^6)$ s=4 ns) of each of the memory banks 321 and 322.

In contrast to this, according to FIG. 4, when the operating frequency (first operating frequency) of the first arithmetic unit 411 is 250 MHz, which is the same as the operating frequency of each of the memory banks 421 and 422, the first arithmetic unit 411 may access only one of the memory banks 421 and 422 within an operation cycle (4 ns) of each of the memory banks 421 and 422.

Therefore, if the operating frequency (first operating frequency) of the in-memory arithmetic unit is increased more than the operating frequency (second operating frequency) of the memory bank, performance of in-memory processing may be increased. Here, FIG. 3 illustrates an example in which the first operating frequency is n times the second operating frequency, but the operating frequency is not limited thereto, and the first operating frequency may be a certain multiple less than or equal to n times the second operating frequency. That is, a relationship between the first operating frequency and the second operating frequency is represented by following Equation 1.

SECOND OPERATING FREQUENCY*1<FIRST OPERATING FREQUENCY≤SECOND OPERATING FREQUENCY*$n$ [Equation 1]

(n is the number of memory banks mapped to one in-memory arithmetic unit)

That is, arithmetic operation performance of the in-memory computation unit may be increased by twice Y giga operation per second (GOPS), which is arithmetic operation performance of a first arithmetic unit 411 in FIG. 4, like 2Y GOPS which is arithmetic operation performance of the first arithmetic unit 311 in FIG. 3. In an example, the in-memory arithmetic units may access any number of the allocated n memory banks within the operation cycle corresponding to the second operating frequency.

Figure 5:
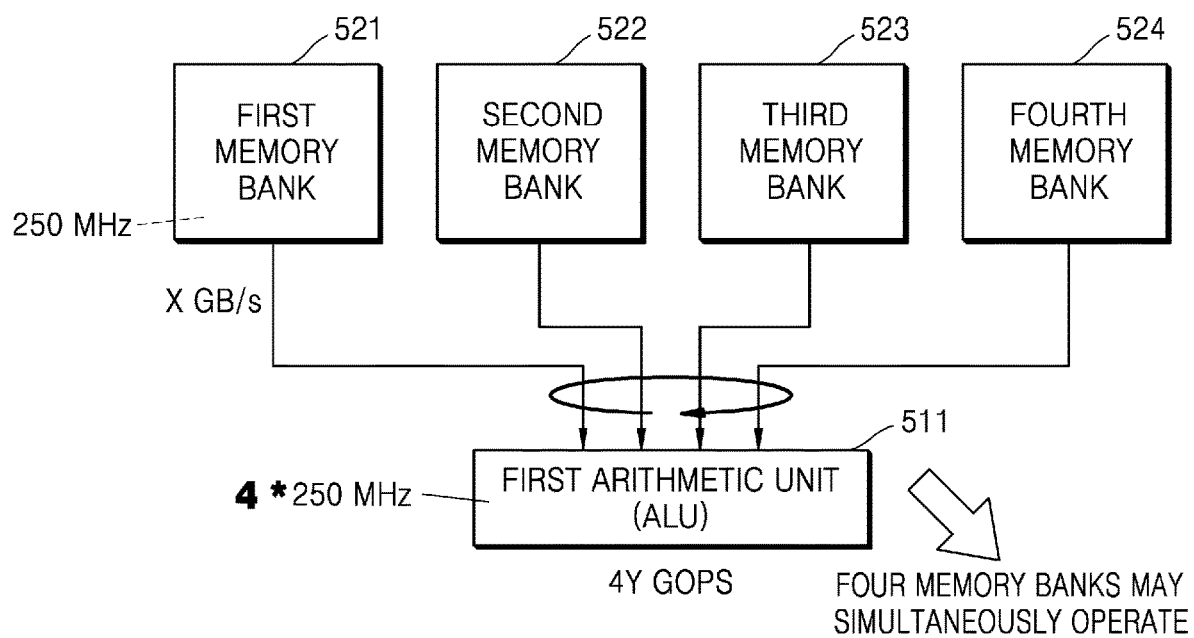
FIG. 5 is a diagram illustrating that four memory banks are allocated to one in-memory arithmetic unit operating at a four-fold operating frequency according to an example.

FIG. 5 is a diagram illustrating that four memory banks are allocated to one in-memory arithmetic unit that operates at a four-fold operating frequency, according to an example.

Referring to FIG. 5, four memory banks (a first memory bank 521, a second memory bank 522, a third memory bank 523, and a fourth memory bank 524) share one in-memory arithmetic unit (the first arithmetic unit 511). It is assumed that data transmission and data reception are performed at a speed of X GB/s between the memory banks 521, 522, 523, and 524 and the arithmetic units 511, and it is assumed that the memory banks 521, 522, 523, and 524 operate at an operating frequency (second operating frequency) of 250 MHz. Here, the operating frequency of 250 MHz is a random value exemplified for the sake of convenient description.

According to FIG. 5, when the operating frequency (first operating frequency) of the first arithmetic unit 511 is 1,000 MHz (4×250 MHz) corresponding to four times (n=4) the operating frequency (second operating frequency) of each of the memory banks 521, 522, 523, and 524, the first arithmetic unit 511 may substantially simultaneously access the memory banks 521, 522, 523, and 524 within an operation cycle ($1/(250\times10^6)$ s=4 ns) of each of the memory banks 521, 522, 523, and 524.

That is, if the operating frequency (first operating frequency) of the in-memory arithmetic unit is increased in proportion to the number of memory banks mapped to one in-memory arithmetic unit, more efficient arithmetic processing (for example, 4Y GOPS) of the in-memory arithmetic unit may be performed within the operation cycle of the memory bank.

Figure 6A:
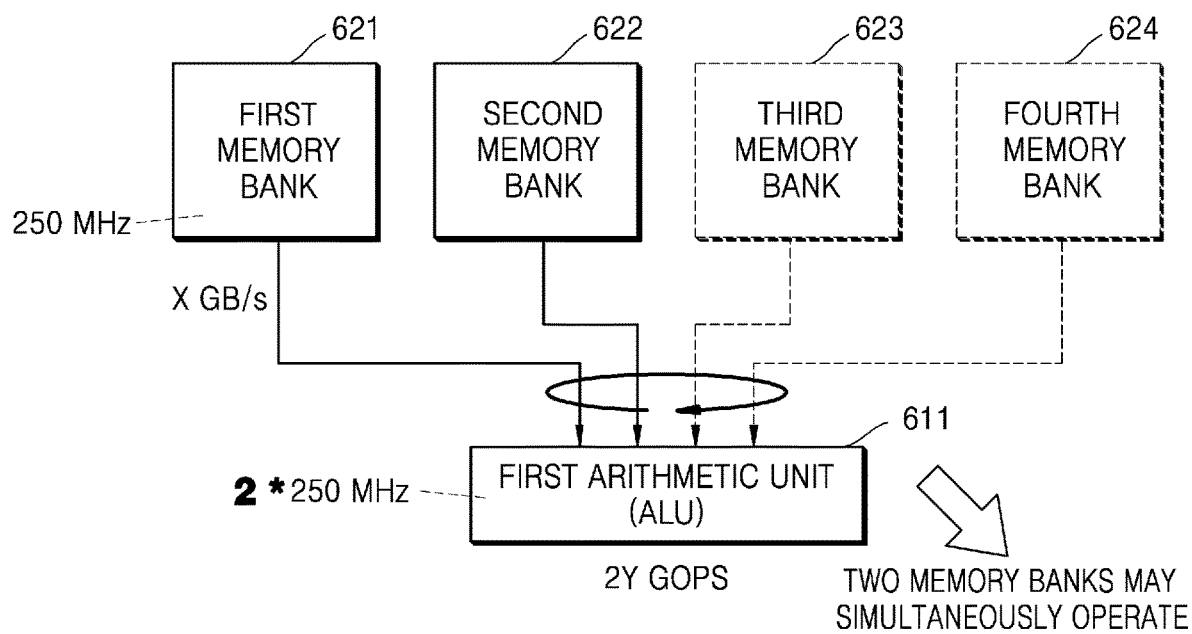
FIGS. 6A and 6B are diagrams for comparing and explaining arithmetic operation performance of an in-memory arithmetic unit based on an operating frequency of one in-memory arithmetic unit to which four memory banks are allocated, according to an example.
Figure 6B:
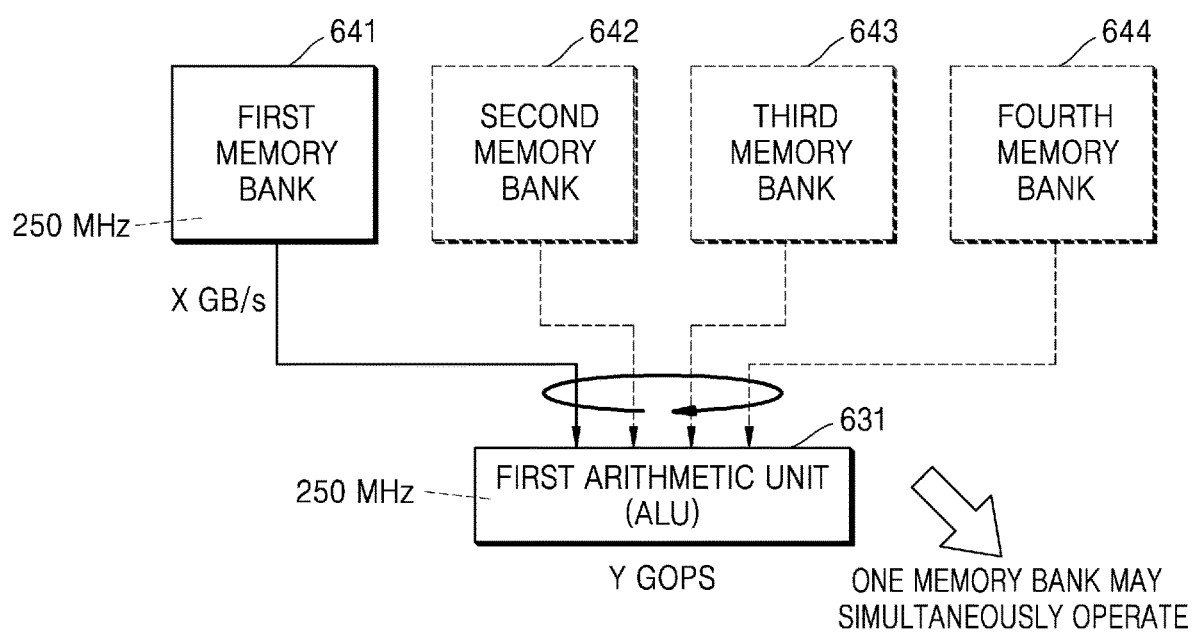

FIGS. 6A and 6B are diagrams for comparing and explaining arithmetic operation performance of an in-memory arithmetic unit based on an operating frequency of one in-memory arithmetic unit to which four memory banks are allocated, according to an example.

Referring to FIG. 6A, four memory banks (a first memory bank 621, a second memory bank 622, a third memory bank 623, and a fourth memory bank 624) are mapped to one in-memory arithmetic unit (a first arithmetic unit 611) (n=4).

An operating frequency (first operating frequency) of the first arithmetic unit 611 of FIG. 6A may be set to 500 MHz (2×250 MHz) corresponding to twice (n=2) of an operating frequency (second operating frequency) of each of the memory banks 621, 622, 623, and 624. That is, the operating frequency (first operating frequency) of the first arithmetic unit 611 may be a certain multiple (that is, twice) less than or equal to n (n=4) times the operating frequency (second operating frequency) of each of the memory banks 621, 622, 623, and 624, as represented by Equation 1. Accordingly, the first arithmetic unit 611 may substantially simultaneously access any two memory banks (for example, a pair of memory banks 621 and 622 or a pair of memory banks 623 and 624) within an operation cycle (4 ns) of the memory bank.

As in FIG. 5, when the operating frequency (first operating frequency) of the in-memory arithmetic unit is increased based on the number of memory banks mapped to one in-memory arithmetic unit, more efficient arithmetic processing (for example, 2Y GOPS) of the in-memory arithmetic unit may be performed within the operation cycle of the memory bank.

FIG. 6B illustrates a case in which the operating frequency (first operating frequency, 250 MHz) of one in-memory arithmetic unit (first arithmetic unit 631) is the same as the operating frequency (second operating frequency, 250 MHz) of the memory banks (a first memory bank 641, a second memory bank 642, a third memory bank 643, and a fourth memory bank 644). That is, "first operating frequency=second operating frequency=250 MHz". Similar to the description made with reference to FIG. 4, the first arithmetic unit 631 of FIG. 6B may access only one of the memory banks 641, 642, 643, and 644 within an operation cycle (4 ns) of each of the memory banks 641, 642, 643, and 644 (Y GOPS).

Figure 7:
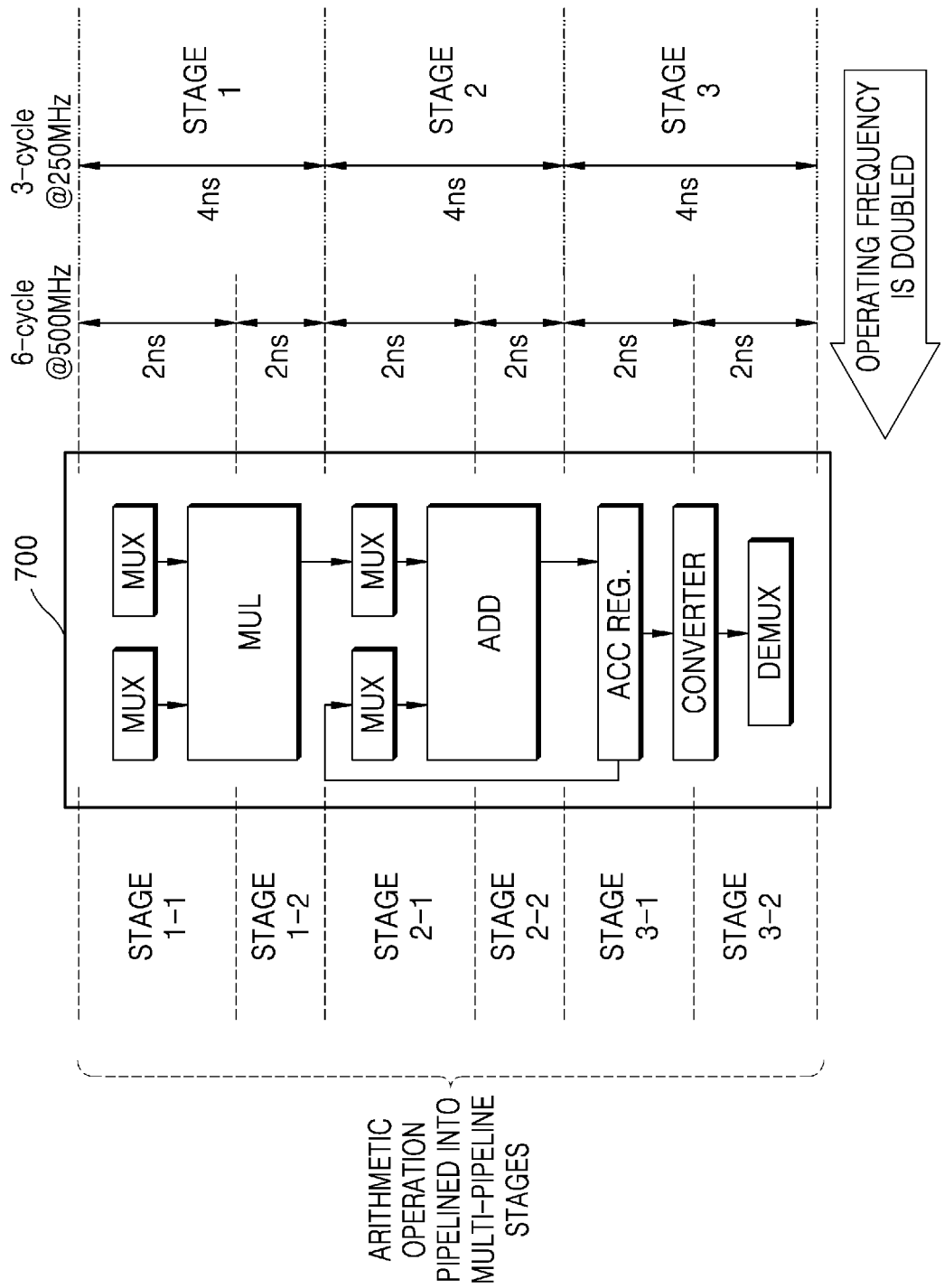
FIG. 7 is a diagram illustrating pipelining of an arithmetic operation according to an example.

FIG. 7 is a diagram illustrating pipelining of an arithmetic operation according to an example.

Pipelining is a technology of increasing an arithmetic processing speed by dividing a process in which an arithmetic operation is performed into several stages and processing the respective stages in parallel (simultaneously).

Referring to FIG. 7, a given arithmetic operation is pipelined into multiple pipeline stages of several sub-arithmetic operations, and thereby, a pipelined arithmetic operation 700 may be generated. Here, the given arithmetic operation may be, for example, an MAC arithmetic operation of a neural network, and each sub-arithmetic operation may correspond to a series of individual arithmetic operations such as data fetch, multiplication operation, addition operation, and data output.

The pipelining processing of the in-memory arithmetic unit operating at exemplary operating frequencies (250 MHz and 500 MHz) illustrated in FIG. 7 will be described in connection with FIGS. 6A and 6B.

When a given arithmetic operation is pipelined in units of an operating frequency of 4 ns corresponding to the operating frequency (that is, 250 MHz) of the in-memory arithmetic unit (first arithmetic unit 631) illustrated in FIG. 6B, the in-memory arithmetic unit (first arithmetic unit 631) of FIG. 6B may process the arithmetic operation 700 (divided into three pipeline stages STAGE 1, STAGE 2, and STAGE 3) pipelined for three cycles and may perform pipelining every cycle (operation cycle: 4 ns). In this case, as described with reference to FIG. 6B, the operating frequency of 250 MHz (operation cycle: 4 ns) of each of the memory banks (641 to 644 in FIG. 6B) is the same as the operating frequency of 250 MHz (operation cycle: 4 ns) of the in-memory arithmetic unit (first arithmetic unit 631), and thus, the in-memory arithmetic unit (first arithmetic unit 631) may access only one of the memory banks 641 to 644 within the operation cycle (4 ns) of the memory banks (641 to 644).

However, when a given arithmetic operation is pipelined in units of operation cycles of 2 ns corresponding to the operation cycle of 500 MHz (2×250 MHz) of the in-memory arithmetic unit (first arithmetic unit 611) illustrated in FIG. 6A, the in-memory arithmetic unit (first arithmetic unit 611) of FIG. 6A may process the arithmetic operation 700 (divided into six pipeline stages (or six sub-arithmetic operations) STAGE 1-1, STAGE 1-2, STAGE 2-1, STAGE 2-2, STAGE 3-1, and STAGE 3-2) pipelined for six cycles and may perform pipelining every cycle (2 ns). In this case, as described with reference to FIG. 6A, the operating frequency of 250 MHz (operation cycle: 4 ns) of each of the memory banks 621 to 624 in FIG. 6A is half the operating frequency of 500 MHz (operation cycle: 2 ns) of the in-memory arithmetic unit (first arithmetic unit 611), and thus, the in-memory arithmetic unit (first arithmetic unit 611) may substantially simultaneously access two memory banks (for example, 621 and 622) within the operation cycle (4 ns) of the memory banks 621 to 624 to process sub-arithmetic operations corresponding to two cycles at once.

That is, the given arithmetic operation is pipelined into multiple pipeline stages of sub-arithmetic units (or sub-arithmetic operations) that may be processed within a first operation cycle corresponding to the first operating frequency of the in-memory arithmetic unit, and when the first operating frequency of the in-memory arithmetic unit is higher than the second operating frequency of the memory bank, the in-memory arithmetic unit may perform in-memory processing of more pipelining arithmetic operations within the same time. Here, a relationship between the first operating frequency and the second operating frequency is the same as the relationship represented by Equation 1 described above. In FIG. 7, MUL, ADD, ACC REG., DEMUX represent a multiplier, an adder, an accumulating register and a demultiplexer, respectively.

Figure 8:
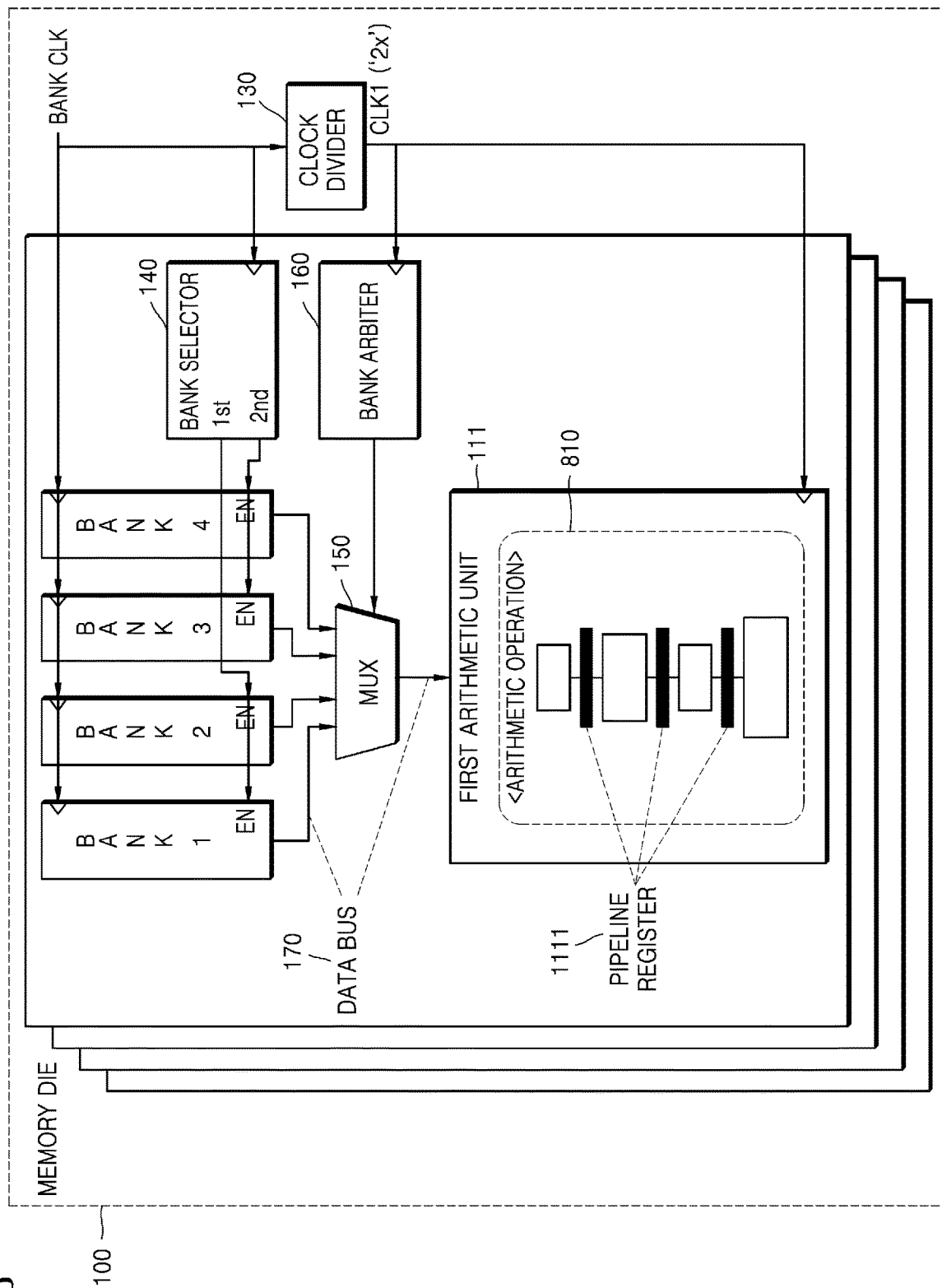
FIG. 8 is a diagram illustrating a hardware connection between an in-memory arithmetic unit and memory banks on a memory die, according to an example.

FIG. 8 is a diagram illustrating a hardware connection between an in-memory arithmetic unit and memory banks on a memory die, according to an example.

Referring to FIG. 8, an implementation example is illustrated in which four memory banks BANK1, BANK2, BANK3, and BANK4 are allocated to one in-memory arithmetic unit (first arithmetic unit 111) on a memory die 100. This may correspond to some of implementation examples of all of the in-memory arithmetic units 110 in FIG. 1 and all of the memory banks 120 in FIG. 1 provided in the memory die 100. Accordingly, the rest of the in-memory arithmetic units 110 and the memory banks 120 on the memory die 100 may be implemented and operated similarly to the in-memory arithmetic units 110 and the memory banks 120 illustrated in FIG. 8.

The in-memory arithmetic unit (first arithmetic unit 111) is connected to the respective memory banks on the memory die 100. In this case, the memory die 100 may include a bank selector 140 that selects any one of the four memory banks BANK1, BANK2, BANK3, and BANK4 allocated to the first arithmetic unit 111, and a bank arbiter 160 for controlling a multiplexer (MUX) 150 (e.g., controlling data to be output from a multiplexer (MUX) 150) that provides the first arithmetic unit 111 with data accessed from a memory bank selected by bank selector 140. Hardware configuration elements implemented on the memory die 100 may be connected to each other through a data bus 170. In an example, the bank selector may sequentially enable one or more of the four memory banks BANK1, BANK2, BANK3, and BANK4 allocated to the first arithmetic unit.

The first arithmetic unit 111 may operate at a first operating frequency to perform in-memory processing of a pipelined arithmetic operation 810. Here, the arithmetic operation 810 may be pipelined into multi-pipeline stages of a sub-arithmetic unit (or sub-arithmetic operation) that may be processed within a first operation cycle corresponding to the first operating frequency of the first arithmetic unit 111. The first arithmetic unit 111 may include at least one pipeline register 1111 for buffering sub-arithmetic operation results in each pipeline stage of the pipelined arithmetic operation 810.

Each of the memory banks BANK1, BANK2, BANK3, and BANK4 may operate at a second operating frequency to perform an access operation of data requested from the first arithmetic unit 111 while the pipelined arithmetic operation is performed.

A clock divider 130 may distribute a clock signal BANK CLK provided from an external device (the memory controller 20 of FIG. 1, a host, or so on) to the in-memory arithmetic units (first arithmetic unit 111) and the memory banks BANK1, BANK. 2, BANK3, and BANK4. Here, the clock divider 130 may provide the clock signal BANK CLK to the memory banks BANK1, BANK2, BANK3, and BANK4 as it is and provide the in-memory arithmetic units (first arithmetic unit 111) with a first clock signal CLK1 for the in-memory arithmetic units (first arithmetic unit 111) to operate at a first operating frequency.

That is, the clock divider 130 may generate the first clock signal CLK1 from the clock signal BANK CLK based on a relationship between the first operating frequency and the second operating frequency and may distribute the first clock signal CLK1. For example, as described with reference to FIG. 6A, when the first operating frequency is twice the second operating frequency, a frequency of the first clock signal CLK1 may be twice a frequency of the clock signal BANK CLK. However, the first clock signal CLK1 may be changed depending on the number n of memory banks allocated to one in-memory arithmetic unit or the relationship (Equation 1) between the first operating frequency and the second operating frequency.

The first arithmetic unit 111 operates at a first operating frequency that is twice the second operating frequency of each of the memory banks BANK1, BANK2, BANK3, and BANK4. In other words, the first operating frequency is twice the second operating frequency. It is previously described that n corresponds to the number of memory banks allocated to one in-memory arithmetic unit, and the relationship between the first operating frequency and the second operating frequency is represented by Equation 1.

Meanwhile, the bank selector 140 may operate at the second operating frequency in response to the clock signal BANK CLK in the same manner as the memory banks BANK1, BANK2, BANK3, and BANK4, and the bank arbiter 160 may operate at the first operating frequency in response to first clock signal CLK1 in the same manner as the first arithmetic unit 111.

The bank selector 140 may provide enable terminals EN of the memory banks BANK1 and BANK2 with a control signal for enabling the memory banks BANK1 and BANK2 within a certain operation cycle through a first terminal 1ST, and may provide enable terminals EN of the memory banks BANK3 and BANK4 with a control signal for enabling the memory banks BANK3 and BANK4 within a next operation cycle through a second terminal 2ND. The bank arbiter 160 may control the multiplexer (MUX) 150 so that the first arithmetic unit 111 may sequentially access two memory banks that are enabled within a certain operation cycle.

Figure 9:
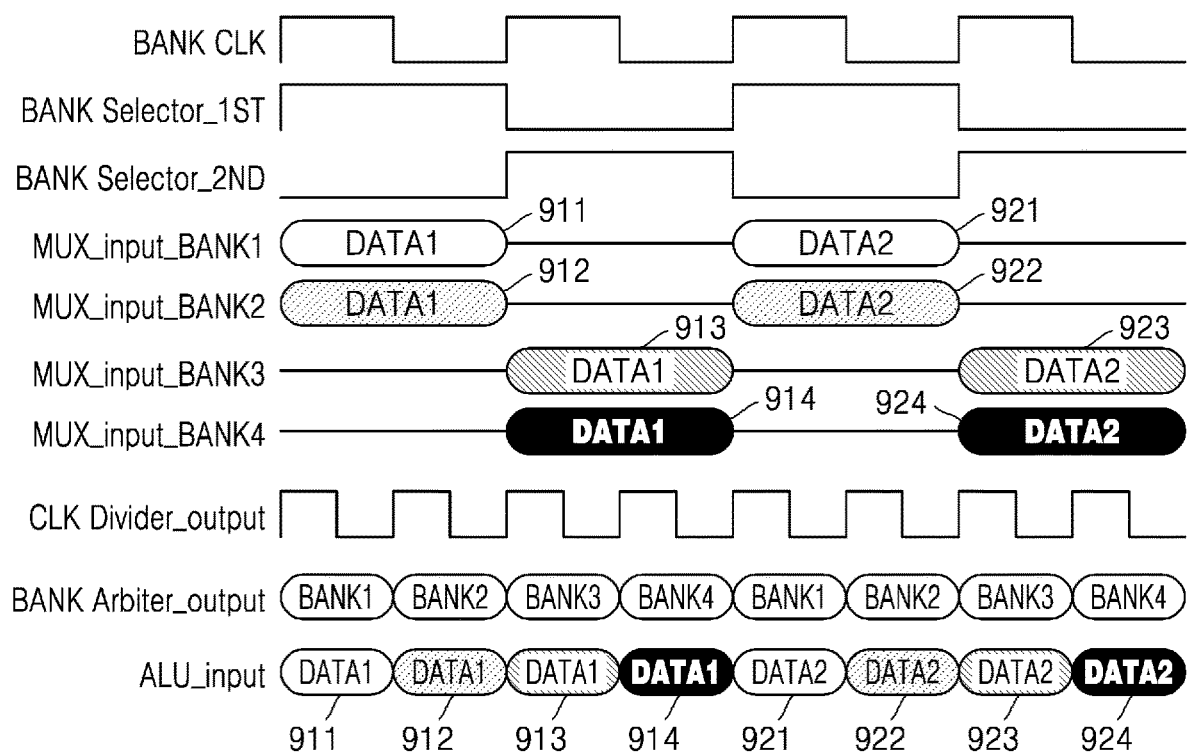
FIG. 9 illustrates a timing diagram when an arithmetic operation is performed by using hardware of a memory device illustrated in FIG. 8.

FIG. 9 illustrates a timing diagram when an arithmetic operation is performed by using hardware of the memory device illustrated in FIG. 8.

Referring to FIG. 9, a frequency of the clock signal BANK CLK is half the frequency of the first clock signal CLK Divider_output (CLK1 in FIG. 8).

During one cycle of the clock signal BANK CLK, the memory banks BANK1 and BANK2 are enabled by a control signal BANK Selector_1ST outputted through the first terminal 1ST of the bank selector 140. At this time, the memory banks BANK3 and BANK4 are in a disabled state.

Because a frequency of the first clock signal CLK Divider_output is twice the frequency of the clock signal BANK CLK, data DATA1 911 and data DATA1 912 of the memory banks BANK1 and BANK2 may be sequentially accessed to the first arithmetic unit 111 during two cycles of the first clock signal CLK Divider_output. According to FIG. 8, in FIG. 9, MUX_input_BANK1, MUX_input_BANK2, MUX_input_BANK3 and MUX_input_BANK4 represent signals output from the memory banks BANK1, BANK2, BANK3, and BANK4 to the multiplexer (MUX) 150 respectively, BANK Arbiter_output represents a signal output from the bank arbiter 160, and ALU_input represents a signal input to the first arithmetic unit 111.

During the next cycle of the clock signal BANK CLK, the data DATA1 913 and data DATA1 914 of the other memory banks BANK3 and BANK4 may be sequentially accessed to the first arithmetic unit 111.

In this order, during the four cycles of the clock signal BANK CLK, the DATA1 911, DATA1 912, DATA1 913, DATA1 914, DATA2 921, DATA2 922, DATA2 923, and DATA2 924 of the memory banks BANK1, BANK2, BANK3, and BANK4 may be sequentially accessed as an input of the first arithmetic unit 111.

Figure 10:
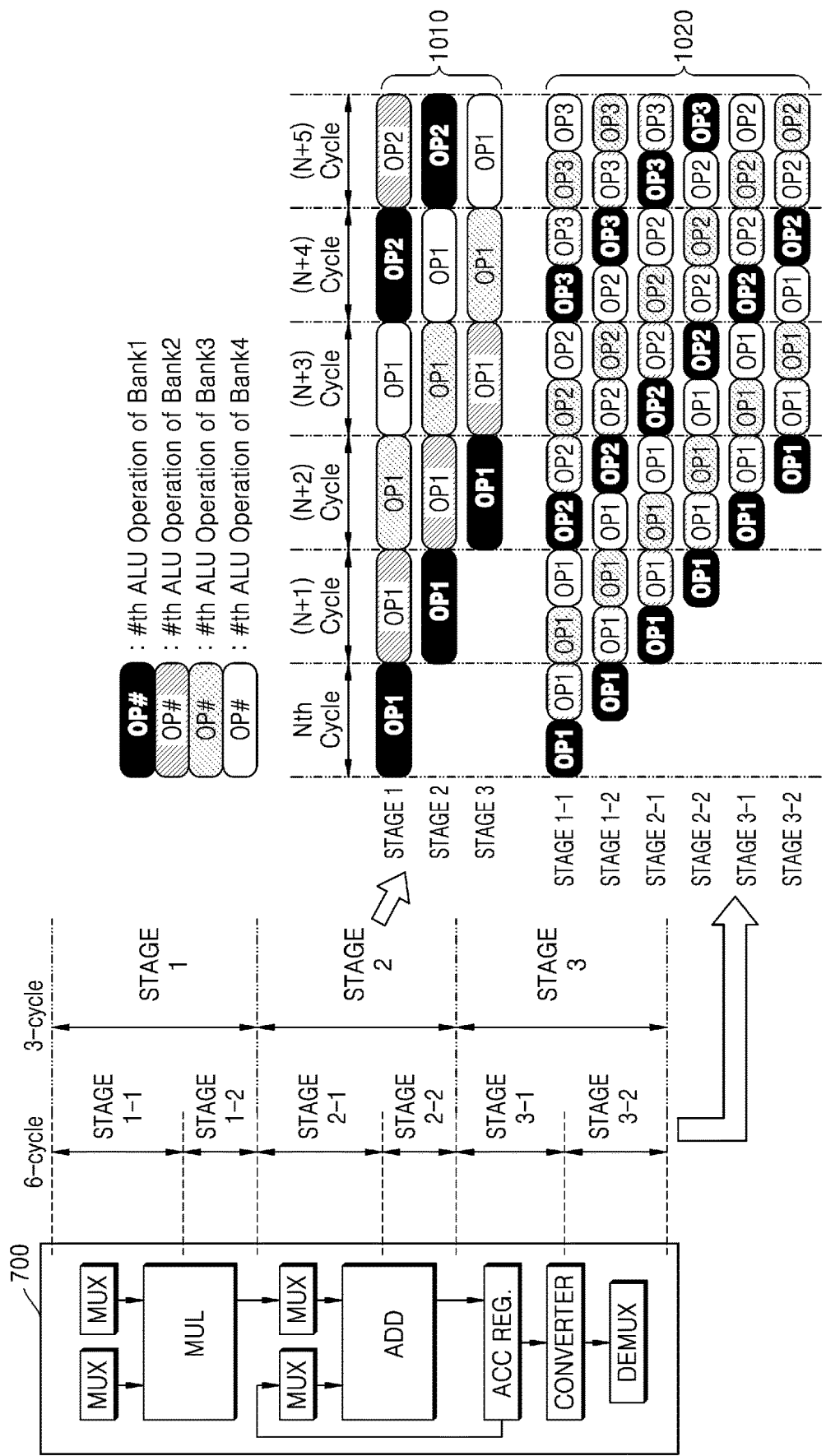
FIG. 10 is a diagram illustrating pipeline stages allocated to respective memory banks when in-memory processing of a pipelined arithmetic operation of FIG. 7 is performed according to an example.

FIG. 10 is a diagram illustrating pipeline stages to be allocated to each memory bank when in-memory processing of the pipelined arithmetic operation of FIG. 7 is performed, according to an embodiment.

Referring to FIG. 10, a pipeline stage allocation 1020 when the operating frequency of the in-memory arithmetic unit is twice the operating frequency of the memory bank is compared with a pipeline stage allocation 1010 when the operating frequency of the in-memory arithmetic unit is the same as the operating frequency of the memory bank.

The pipelined arithmetic operation 700 includes multi-pipeline stages of six sub-arithmetic operations STAGE 1-1 to STAGE 3-2. Each arithmetic operation OP # (e.g., OP1, OP2 or OP3) performed by the first arithmetic unit 111 illustrated in FIG. 8 may correspond to one of six sub-arithmetic operations STAGE 1-1 to STAGE 3-2 of the pipelined arithmetic operation 700.

The pipeline stage allocation 1020 in each timeline (cycle) corresponds to pipelining according to the in-memory processing of the first arithmetic unit 611 (operating frequency: 500 MHz and operation cycle: 2 ns) and the memory banks 621 to 624 (operating frequency: 250 MHz and operation cycle: 4 ns) described in FIG. 6A.

Specifically, during a Nth cycle, the first arithmetic unit 611 accesses the first memory bank 621 to perform a first arithmetic operation OP1 of the sub-arithmetic operation STAGE 1-1 and accesses the second memory bank 622 to perform the first arithmetic operation OP1 of the sub-arithmetic operation STAGE 1-1. Meanwhile, the first arithmetic unit 611 may access data of the first arithmetic operation OP1 from the first memory bank 621 and at the same time perform pipelining of the first arithmetic operation OP1 of the next sub-arithmetic operation STAGE 1-2. In this way, the first arithmetic unit 611 may alternately access the memory banks 621 to 624 even in the (N+5)th cycle illustrated in FIG. 10 and subsequent cycles, thereby performing the pipelined arithmetic operation 700.

Meanwhile, the pipeline stage allocation 1010 corresponds to pipelining according to in-memory processing of the first arithmetic unit 631 (operating frequency: 250 MHz and operation cycle: 4 ns) and the memory banks 641 to 644 (operating frequency: 250 MHz and operation cycle: 4 ns) described with reference to FIG. 6B, and when compared with the pipeline stage allocation 1020 described above, arithmetic operation throughput of the first arithmetic unit 631 is lower. That is, by increasing the operating frequency (first operating frequency) of the in-memory arithmetic unit more than the operating frequency (second operating frequency) of the memory banks, more arithmetic operation throughput may be process more quickly, and thus, arithmetic operation performance of the in-memory arithmetic unit may be increased.

Figure 11:
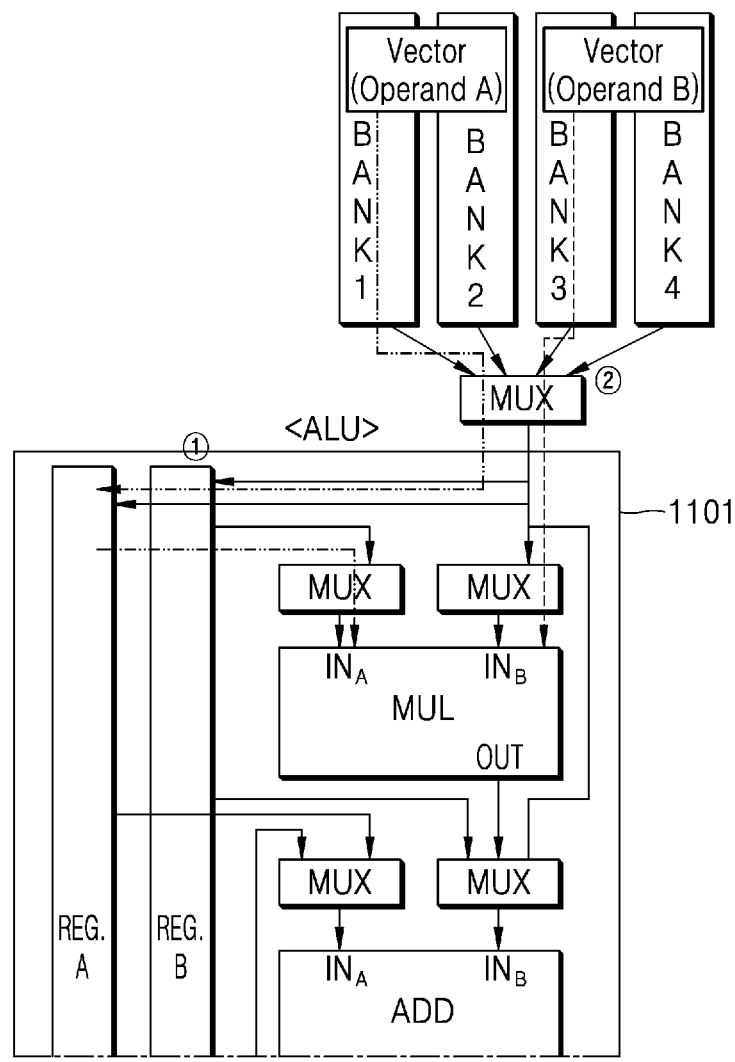
FIG. 11 is a diagram illustrating vector operations performed in an in-memory arithmetic unit according to an example.

FIG. 11 is a diagram illustrating that vector operation is performed by an in-memory arithmetic unit, according to an example.

Referring to FIG. 11, in order for an in-memory arithmetic unit 1101 to perform vector operation of an operand A stored in the memory banks BANK1 and BANK2 and an operand B stored in the memory banks BANK3 and BANK4, two steps of processing are required. Specifically, first, the in-memory arithmetic unit 1101 accesses the first memory bank BANK1 to read the operand A and stores the read operand A in a register REG. A (cycle ①). Then, the in-memory arithmetic unit 1101 accesses the third memory bank BANK3 to read an operand B and performs vector operation (multiplication) between the read operand B and the operand A stored in the register REG. A (cycle ②). That is, in order to perform matrix operation (or vector operation) such as MAC arithmetic operation, the in-memory arithmetic unit 1101 may perform an arithmetic operation between the operands during two cycles. The arithmetic processing corresponds to a case in which only one multiplexer (MUX) is provided between the in-memory arithmetic unit 1101 and the memory banks 1-4 (e.g., the first memory bank BANK1 to the fourth memory bank BANK4). However, when more multiplexers (MUXs) are provided between the in-memory arithmetic unit 1101 and the memory banks 1-4, more efficient arithmetic operation may be performed by simultaneously reading two operands from different memory banks. In FIG. 11, $IN_A$ and $IN_B$ represent terminates, which input the operand A and the operand B respectively, of the multiplier (MUL) and the adder (ADD), OUT represents an output terminate of the multiplier (MUL).

Figure 12:
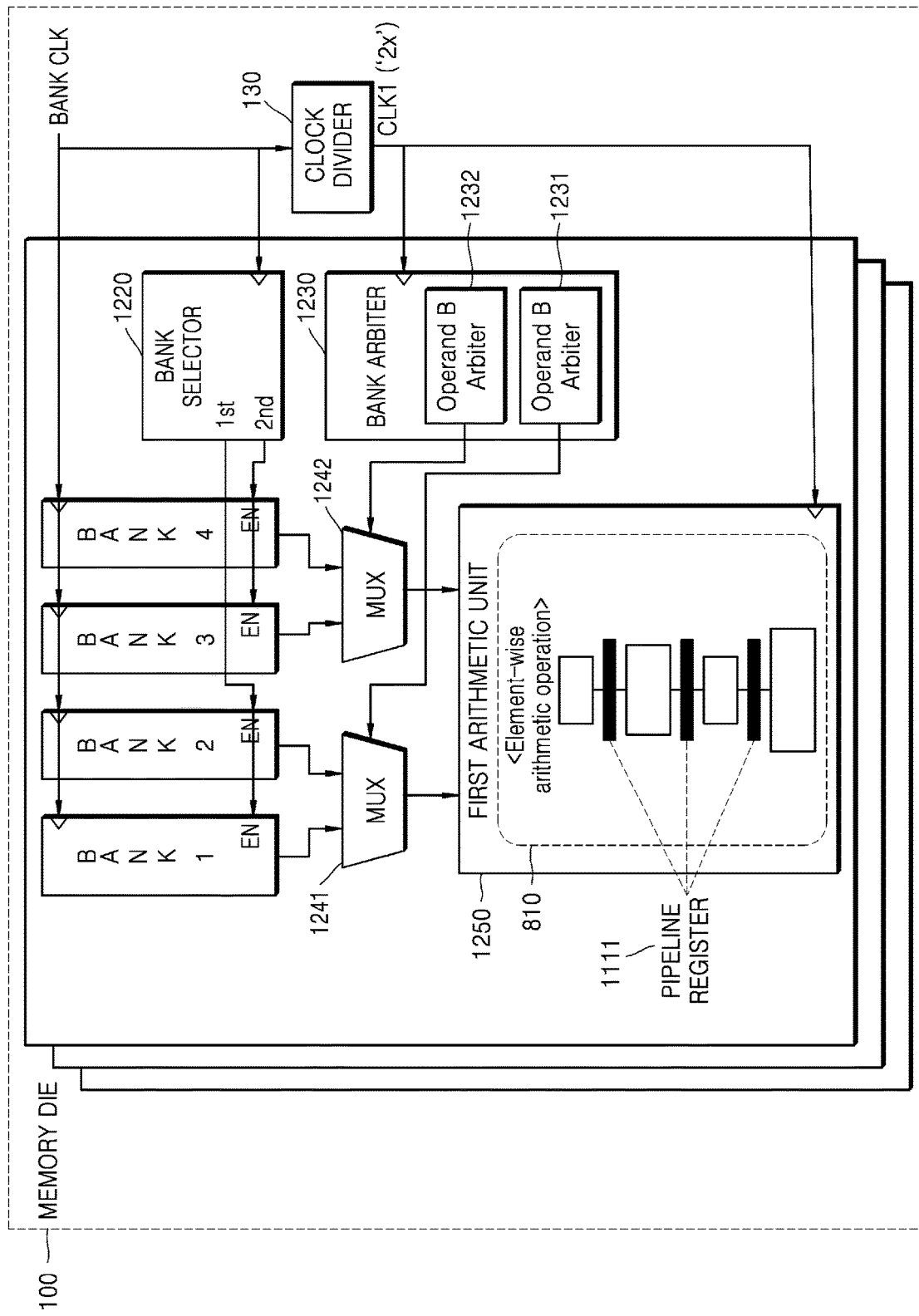
FIG. 12 is a diagram illustrating a hardware connection between an in-memory arithmetic unit and memory banks on a memory die according to another example.
Figure 13:
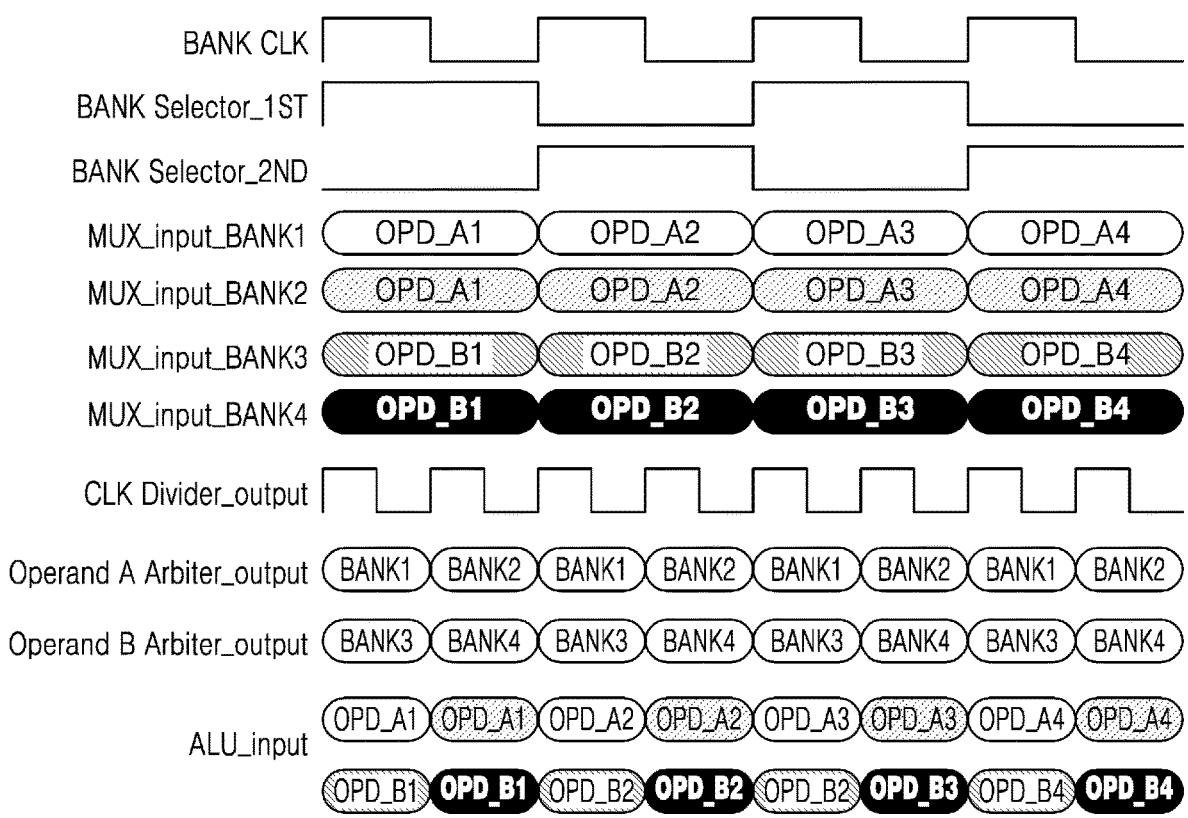
FIG. 13 illustrates a timing diagram when an arithmetic operation is performed by using hardware of a memory device illustrated in FIG. 12.

FIG. 12 is a diagram illustrating a hardware connection between an in-memory arithmetic unit and memory banks on a memory die, according to another example, and FIG. 13 illustrates a timing diagram when an arithmetic operation is performed by using hardware of a memory device illustrated in FIG. 12.

Referring to FIG. 12, unlike the description previously made with reference to FIG. 8, two multiplexers (MUXs) 1241 and 1242 are provided between an in-memory arithmetic unit 1250 and the memory banks BANK1 to BANK4. In addition, a bank arbiter 1230 includes an operand A arbiter 1231 and an operand B arbiter 1232 that independently control the respective multiplexers (MUXs) 1241 and 1242.

According to the timing diagram of FIG. 13, during one cycle of the clock signal BANK CLK, the bank selector 1220 provides control signals BANK Selector_1ST and BANK Selector_2ND for enabling all the memory banks BANK1 to BANK4 to the memory banks BANK1 to BANK4 through the first terminal 1ST and the second terminal 2ND.

Because the frequency of the first clock signal CLK Divider_output is twice the frequency of the clock signal BANK CLK, operand A data OPD_A1 of the first memory bank BANK1, operand A data OPD_A1 of the second memory bank BANK2, operand B data OPD_B1 of the third memory bank BANK3, and operand B data OPD_B1 of the fourth memory bank BANK4 may all be accessed during two cycles of the first clock signal CLK Divider_output. Here, because the multiplexers (MUXs) 1241 and 1242 may substantially simultaneously access the memory banks BANK1 and BANK2 or the memory banks BANK3 and BANK4 by the operand A arbiter 1231 and the operand B arbiter 1232, the in-memory arithmetic unit 1250 may substantially simultaneously access operand A data OPD_A1, OPD_A2, OPD_A3 or OPD_A4 and operand B data OPD_B1, OPD_B2, OPD_B3 or OPD_B4. Accordingly, the in-memory arithmetic unit 1250 may perform an arithmetic operation between the operand A and the operand B within one operation cycle of the in-memory arithmetic unit 1250. In FIG. 13, Operand A Arbiter_output and Operand B Arbiter_output represent signals output from the operand A arbiter 1231 and the operand B arbiter 1232 respectively.

Figure 14:
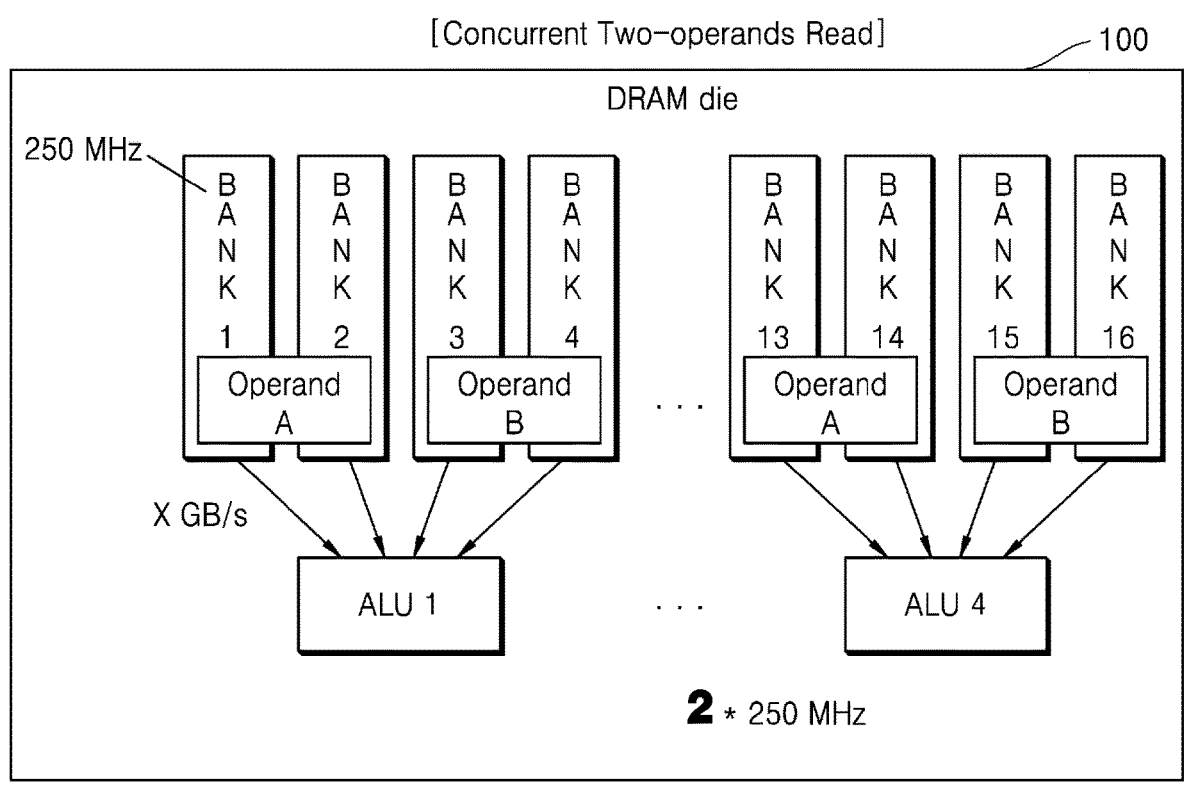
FIG. 14 is a diagram illustrating that in-memory processing of different operands stored in different memory banks is performed by using the hardware implementation described in FIG. 12.

FIG. 14 is a diagram illustrating in-memory processing of different operands stored in different memory banks by using hardware implementation described with reference to FIG. 12.

Referring to FIG. 14, when the operating frequency (2×250 MHz) of each of the in-memory arithmetic units (ALU1 to ALU4) is greater than the operating frequency (250 MHz) of each of the memory banks (BANK1 to BANK16), the arithmetic operation between different operands (operand A and operand B) stored in different memory banks BANK1 to BANK16 may be performed within one operation cycle (that is, 1/(2×250 MHz)=2 ns) of each of the in-memory arithmetic units ALU1 to ALU4) by using the hardware implementation which is described with reference to FIG. 12 and in which a plurality of multiplexers (MUXs) capable of being independently accessed to the memory banks BANK1 to BANK16 are provided.

Figure 15:
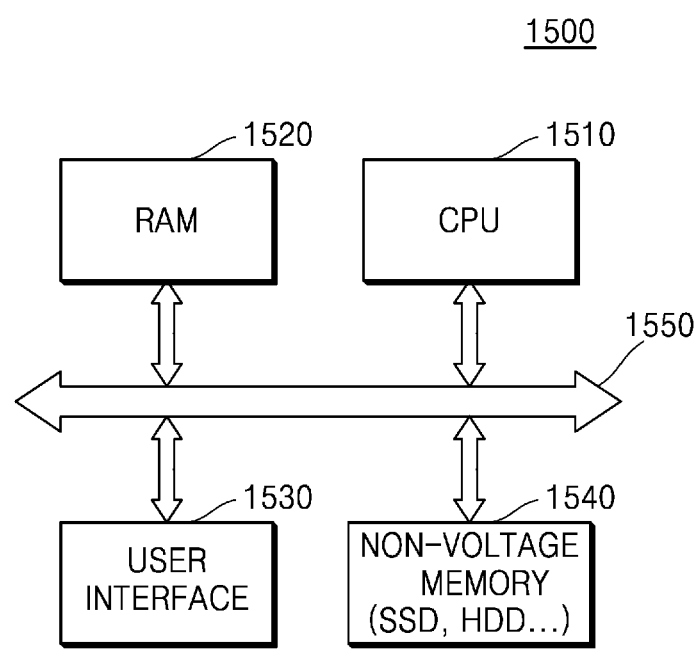
FIG. 15 is a block diagram illustrating a computing system including a memory device according to an example.

FIG. 15 is a block diagram illustrating a computing system including a memory device according to an example. A memory device that performs the in-memory processing described above may be mounted as a RAM 1520 in a computing system 1500 such as a mobile device or a desktop computer. Any one of the memory devices according to the above-described examples may be applied to the memory device mounted as the RAM 1520.

Specifically, a memory device that performs in-memory processing and is mounted as the RAM 1520 may include a plurality of in-memory arithmetic units that perform in-memory processing of a pipelined arithmetic operation, and a plurality of memory banks that are allocated to each in-memory arithmetic unit in units of n memory banks and perform an access operation of data requested from each in-memory arithmetic unit while the pipelined arithmetic operation is performed. Here, each of the in-memory arithmetic units may operate at the first operating frequency that is less than or equal to n times the second operating frequency of each of the memory banks.

The computing system 1500 includes a central processing unit (CPU) 1510, a RAM 1520, a user interface 1530, and a nonvolatile memory 1540, which are electrically connected to a bus 1550. The nonvolatile memory 1540 may include a mass storage device such as a solid state drive (SSD) or a hard disk drive (HDD).

As the memory device (or memory system) described above is applied to the computing system 1500, a memory device included in the RAM 1520 may perform in-memory processing.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A memory device configured to perform in-memory processing, the memory device comprising:
 a plurality of in-memory arithmetic units each configured to perform in-memory processing of a pipelined arithmetic operation; and
 a plurality of memory banks allocated to the in-memory arithmetic units such that a set of n memory banks is allocated to each of the in-memory arithmetic units, wherein n is at least two, and each of the memory banks is configured to perform an access operation of data requested from a corresponding in-memory arithmetic unit while the pipelined arithmetic operation is performed, wherein each of the in-memory arithmetic units is configured to operate at a first operating frequency and simultaneously access respective allocated memory banks, wherein each of the memory banks is configured to operate at a second operating frequency, wherein the first operating frequency is higher than the second operating frequency and is less than or equal to a product of the second operating frequency and n, wherein n is a number of memory banks allocated to each of the in-memory arithmetic units.

2. The memory device of claim 1, wherein the arithmetic operation is pipelined into multi-pipeline stages of sub-arithmetic units capable of being processed within a first operation cycle corresponding to the first operating frequency.

3. The memory device of claim 2, wherein each of the in-memory arithmetic units is configured to access any number of the allocated n memory banks within a second operation cycle corresponding to the second operating frequency of each of the memory banks.

4. The memory device of claim 1, further comprising:
a pipeline register configured to buffer sub-arithmetic operation results of pipeline stages of the pipelined arithmetic operation.

5. The memory device of claim 1, further comprising:
a clock divider configured to generate, based on an externally provided clock signal, a first clock signal for the in-memory arithmetic units to operate at the first operating frequency and to distribute the first clock signal to the in-memory arithmetic units.

6. The memory device of claim 1, further comprising:
a bank selector configured to sequentially enable one or more of the n memory banks allocated to a first in-memory arithmetic unit, which is included in the plurality of in-memory arithmetic units;
a multiplexer configured to provide the first in-memory arithmetic unit with data accessed from the one or more memory banks enabled by the bank selector; and
a bank arbiter configured to control data to be output from the multiplexer.

7. The memory device of claim 6, wherein
the bank selector is configured to operate based on the second operating frequency, and
the bank arbiter is configured to operate based on the first operating frequency.

8. The memory device of claim 1, wherein
the n memory banks allocated to a first in-memory arithmetic unit, which is included in the plurality of in-memory arithmetic units, include a first memory bank in which a first operand is stored and a second memory bank in which a second operand is stored, and
the memory device further comprises a first multiplexer for multiplexing the first operand and a second multiplexer for multiplexing the second operand, the first multiplexer and the second multiplexer being provided between the n memory banks allocated to a first in-memory arithmetic unit and the first in-memory arithmetic unit.

9. The memory device of claim 8, wherein the first multiplexer and the second multiplexer are configured to respectively provide the first in-memory arithmetic unit with the first operand and the second operand within a first operation cycle corresponding to the first operating frequency.

10. The memory device of claim 1, wherein the operating frequency of each of the in-memory arithmetic units is equal to a n number of memory banks allocated to each of the in-memory units multiplied by the operating frequency of the memory banks.

11. The memory device of claim 1, wherein one of the in-memory arithmetic units is configured to perform an arithmetic operation between a first operand and a second operand that are both in one or more of the memory banks.

12. The memory device of claim 11, wherein a result of the arithmetic operation is outputted from the memory device and wherein the first operand and the second operand are not changed by the arithmetic operation.

13. A memory device configured to perform in-memory processing, comprising:
a plurality of in-memory arithmetic units each configured to perform in-memory processing of a pipelined arithmetic operation;
a plurality of memory banks allocated to each of the in-memory arithmetic units such that a set of n memory banks is allocated to each of the in-memory arithmetic units, wherein n is at least two, and each memory bank is configured to perform an access operation of data requested from the in-memory arithmetic units while the pipelined arithmetic operation is performed; and
at least one multiplexer configured to provide each of the in-memory arithmetic units with data accessed from at least one memory bank that is enabled among the n memory banks allocated to each of the in-memory arithmetic units,
wherein each of the in-memory arithmetic units is configured to operate at a first operating frequency and simultaneously access respective allocated memory banks,
wherein each of the memory banks is configured to operate at a second operating frequency, and
wherein the first operating frequency is higher than the second operating frequency and is less than or equal to a product of the second operating frequency and n, wherein n is a number of memory banks allocated to each of the in-memory arithmetic units.

14. The memory device of claim 13, wherein the arithmetic operation is pipelined into multi-pipeline stages of sub-arithmetic units capable of being processed within a first operation cycle corresponding to the first operating frequency.

15. The memory device of claim 14, wherein each of the in-memory arithmetic units configured to access any number of the allocated n memory banks within a second operation cycle corresponding to the second operating frequency of each of the memory banks.

16. The memory device of claim 13, wherein
the n memory banks allocated to a first in-memory arithmetic unit, which is included in the plurality of in-memory arithmetic units, include a first memory bank in which a first operand is stored and a second memory bank in which a second operand is stored, and
the at least one multiplexer includes a first multiplexer configured to multiplex the first operand and a second multiplexer configured to multiplex the second operand.

17. The memory device of claim 13, wherein the first operating frequency is dependent on a total number of the n memory banks allocated to each of the in-memory arithmetic units.

18. A memory device configured to perform in-memory processing, the memory device comprising:

a plurality of in-memory arithmetic units each configured to perform in-memory processing of a pipelined arithmetic operation; and a plurality of memory banks allocated to the in-memory arithmetic units such that a set of n memory banks is allocated to each of the in-memory arithmetic units, wherein n is at least two, and each of the memory banks is configured to perform an access operation of data requested from a corresponding in-memory arithmetic unit while the pipelined arithmetic operation is performed, wherein each of the in-memory arithmetic units is configured to operate at a first operating frequency and simultaneously access respective allocated memory banks, wherein each of the memory banks is configured to operate at a second operating frequency, wherein the first operating frequency is higher than the second operating frequency and is less than or equal to a product of the second operating frequency and n, wherein n is a number of memory banks allocated to each of the in-memory arithmetic units, and wherein the first operating frequency is dependent on a total number of the n memory banks allocated to each of the in-memory arithmetic units.

\* \* \* \* \*